United States Patent [19]

Oomachi et al.

[11] Patent Number: 5,361,491

[45] Date of Patent: Nov. 8, 1994

[54] PROCESS FOR PRODUCING AN IC-MOUNTING FLEXIBLE CIRCUIT BOARD

[75] Inventors: Chikafumi Oomachi, Chiba; Yasuyuki Tanaka, Ibaraki, both of Japan

[73] Assignee: Nippon Mektron, Ltd., Tokyo, Japan

[21] Appl. No.: 67,231

[22] Filed: May 26, 1993

Related U.S. Application Data

[62] Division of Ser. No. 689,907, May 30, 1991, abandoned.

[51] Int. Cl.$^5$ ............................................. H01K 3/10
[52] U.S. Cl. ........................................ 29/852; 29/832; 29/840; 427/97; 437/209
[58] Field of Search ................. 29/832, 840, 852; 437/203, 209; 427/97

[56] References Cited

U.S. PATENT DOCUMENTS 3,387,365  6/1968  Stelmak ............................. 29/840
3,832,769  9/1979  Olyphant, Jr. et al. ............. 29/832

*Primary Examiner*—Carl J. Arbes
*Attorney, Agent, or Firm*—Chilton, Alix & Van Kirk

[57] ABSTRACT

An IC-mounting flexible circuit board and the process of producing the same in which the process comprises the steps of forming bump protrusions passing through a flexible circuit board to be electrically conductive with a circuit wiring pattern in such a way that the bump protrusions are allowed to protrude from the back surface of the flexible circuit board, and arranging to have the surface of each bump protrusion coated with junction metal in accordance with the structure of the protrusion, so that a bare IC chip is simply bonded to the bump protrusions of the flexible circuit board by means of heat fusion or ultrasonic bonding.

An excimer laser means is preferably used for boring small holes in an insulating base to form bump protrusions, i.e., IC pad junction protrusions on the flexible circuit board. Such an IC pad junction protrusion is formed by a plating means such as soldering or the filling of a conductive member. Moreover, a reflow process is employed to form the preferably semicircular protruding portion of the IC pad junction protrusion.

11 Claims, 8 Drawing Sheets

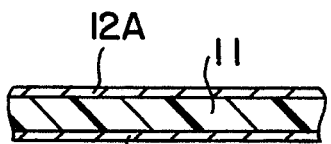
FIG. 9A
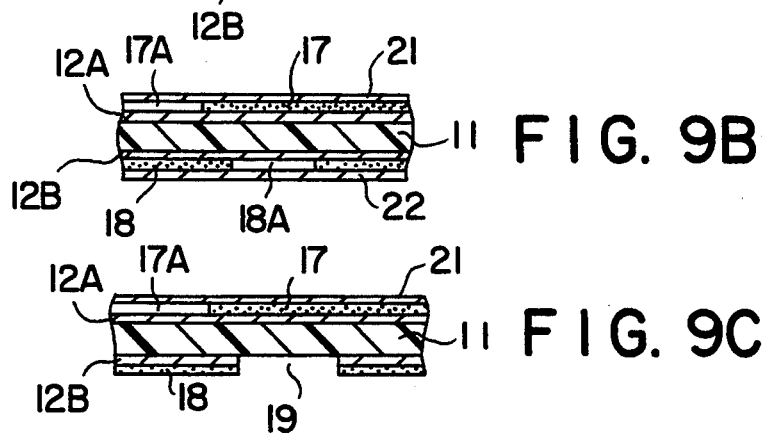
FIG. 9B
FIG. 9C
FIG. 9D
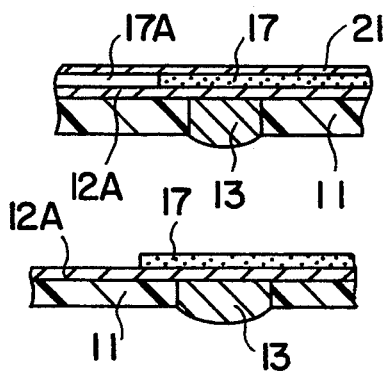
FIG. 9E
FIG. 9F
FIG. 9G

PROCESS FOR PRODUCING AN IC-MOUNTING FLEXIBLE CIRCUIT BOARD

This is a divisional of co-pending application Ser. No. 07/689,907 filed on May 30, 1991, now abandoned.

BACKGROUND OF THE INVENTION

1. Technical Field

The present invention relates to flexible circuit boards capable of directly supporting unpackaged IC chips and the process of producing the same. More particularly, the present invention related to a method for the fabrication of a to IC-mounting flexible circuit board comprising the steps of forming holes in the insulating base of a flexible circuit board, preferably made by using a non-adhesive flexible electrically-conductive laminated board, and forming protruding conductive junction portions on the board by plating the holes so that the protruding junction portions may be employed to establish electrical connections to the pads of the unpackaged, bare, i.e., IC-chips.

2. Prior Art

There are known methods of mounting unpackaged IC chips on circuit boards using junction bumps, including the tab method wherein, as shown in FIGS. 10A and 10B, bumps 3 formed on respective bonding pads 2 of a bare IC chip 1 or bumps 6 formed on respective lead fingers 5 on chip carrier tapes 4 are employed for providing connection by means of heat fusion or ultrasonic bonding, and the proposed flip chip method wherein, as shown in FIG. 11, bumps 3 formed on a bare IC chip 1 are connected to respective conductive patterns 8 of a circuit board 7 by soldering. In the case of the flip chip method, it is common to provide solder-flow preventing dams on the respective conductive patterns 8 as shown in FIG. 11.

In the case of the tab method of FIG. 10A, however, a number of steps are required to form the bumps 3 on the bare IC chip 1, which will result in cost increase. Alternatively, although it has been attempted to adopt a method of transferring the bump 6 to the leading end of each lead finger 5 as shown in FIG. 10B, this method necessitates not only a transfer bonding step but also the provision of special jigs for making the bump. Moreover, there is still a limit in increasing its structural density. As a support is not provided for the lead finger 5 in both methods described above, its mechanical strength is insufficient and as the lead finger 5 is provided with no insulating material, the bonding pads 2 cannot be disposed zigzag. In addition, because of the projecting structure of the lead finger 5, it is prone to deformation and this makes it difficult to maintain the positional accuracy in the directions of X, Y and Z.

In the case of the flip chip method of FIG. 11, on the other hand, the formation of the bumps 3 on the IC bare chip 1 requires a number of steps, which also results in cost increase likewise. Moreover, the necessity of forming the solder-flow preventive dam 9 in the vicinity of each pad of the circuit board 7 also tends to increase the cost further and there is still a limit in increasing its structural density.

DISCLOSURE OF THE INVENTION

The present invention overcomes the disadvantages of the above-discussed prior art by providing a method of producing an IC-mounting flexible circuit board comprising the steps of forming conductive protrusions, i.e., bumps, which pass through a flexible circuit board and are electrically connected to a circuit wiring pattern on the "front" of the board. The bump protrusions protrude from the back surface of the flexible circuit board and the surface of each bump protrusion is coated with junction metal, in accordance with the structure of the protrusion, so that a bare IC chip may be simply bonded to the bump protrusions of the flexible circuit board by means of heat fusion or ultrasonic bonding.

The IC-mounting flexible circuit board according to the present invention employs a one- or both-sided non-adhesive flexible conductive laminated board preferably free from an adhesive layer between a flexible insulating base and a conductive layer. Holes are bored in the insulating base in such a way that the hole reaches a desired region of a circuit wiring pattern formed on one side of the insulating base. The hole thus bored is provided with a conductive member formed with a plating member electrically junctioned to the desired region of the circuit wiring pattern. The conductive member is allowed to protrude from the other side of the insulating base to form an IC pad junction protrusion which functions as a bump for IC bonding.

The IC pad junction protrusions thus formed with the conductive members may readily be disposed zigzag in conformity with the location of the IC pads. The whole junction protrusion may be formed with a conductive plating member that can readily be joined to the IC pad made of gold, tin, lead-tin alloy or the like and besides it is possible to first form the IC pad junction protrusion with a copper plating member and then coat its leading protruding portion equivalent to the bump with the conductive plating member that can readily be joined to the IC pad. Preferably, the hole may be filled with the copper plating member and further the region corresponding to the bump may be formed with at solder member deposited on the copper plating member.

Various techniques are applicable to the production of such IC-mounting flexible circuit boards as stated above. When the one-sided non-adhesive flexible conductive laminated board is used, there may be employed a technique basically comprising the steps of forming a hole reaching a conductive layer from an insulating base first, forming an IC pad junction protrusion by filling the hole with a conductive member by plating, the IC pad junction protrusion having one end tightly joined to the conductive layer and the other protruding from an insulating base, and applying a desired circuit wiring patterning process to the conductive layer with respect to the junction protrusion. When the both-sided non-adhesive flexible conductive laminated board is used, there may be employed a technique basically comprising the steps of applying a desired circuit wiring patterning process to one side of one of both the conductive layers, forming a conductive-layer removing portion necessary for forming a hole in the other side of the other conductive layer, the hole reaching the desired region of the circuit wiring pattern from an insulating base, forming the hole in the insulating base portion exposed in the removing portion, removing the unnecessary conductive layer left on the hole side, and forming an IC pad junction protrusion by filling the hole with a conductive men, her by plating, the IC pad junction protrusion having one end tightly joined to the desired region of the circuit wiring pattern and the other protruding from the insulating base.

When the both-sided non-adhesive flexible conductive laminated board is used, there may also be employed a technique preferably basically comprising the steps of forming a resist pattern corresponding to a desired circuit wiring pattern on one side of one of both the conductive layers, forming a conductive-layer removing portion necessary for forming a hole in the other side of the other conductive layer, the hole reaching the desired region of the conductive layer corresponding to the circuit wiring pattern from an insulating base, forming the hole in the insulating base portion exposed in the removing portion, removing the unnecessary conductive layer left on the hole side, forming an IC pad junction protrusion by filling the hole with a conductive member by plating, the IC pad junction protrusion having one end tightly joined to the desired region of the conductive layer corresponding to the circuit wiring pattern and the other protruding from the insulating base, and finally using the resist pattern to apply a desired circuit wiring patterning process.

In those techniques described above, some steps may be added or varied in forming the aforementioned IC pad junction protrusion, which will subsequently be described in detail.

BRIEF DESCRIPTION OF THE DRAWINGS

FIGS. 9(A), 9(B), 9(C), 9(D), 9(E), 9(F) and 9(G) show a process flow diagram of still another IC-mounting flexible circuit board formed similarly using a dry photoresist film with a protective film according to the present invention.

DETAILED DESCRIPTION OF THE PREFERRED EMBODIMENTS

Figure 1:
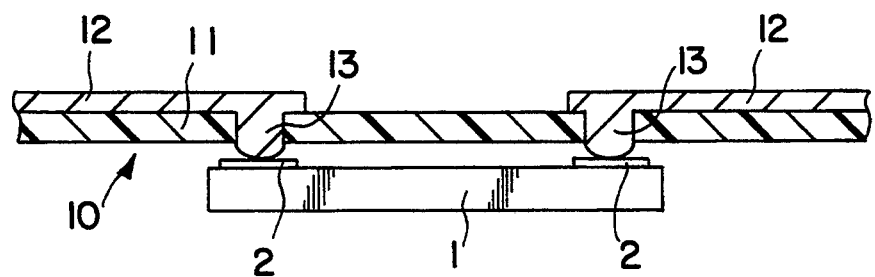
FIG. 1 is a conceptual sectional block diagram of an IC-mounting flexible circuit board with IC pad junction protrusions according to the present invention.
Figure 2:
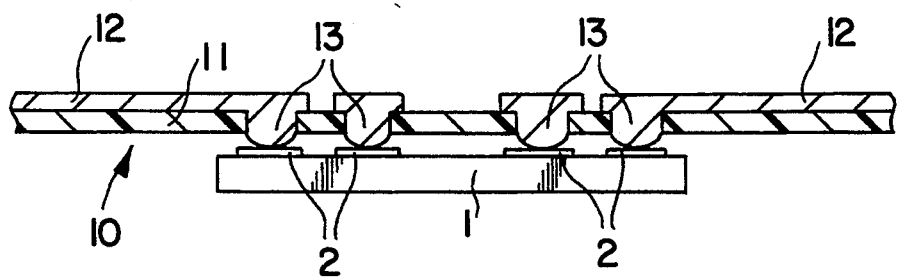
FIG. 2 is another conceptual sectional block diagram of an IC-mounting flexible circuit board with IC pad junction protrusions disposed zigzag according to the present invention.
Figure 3:
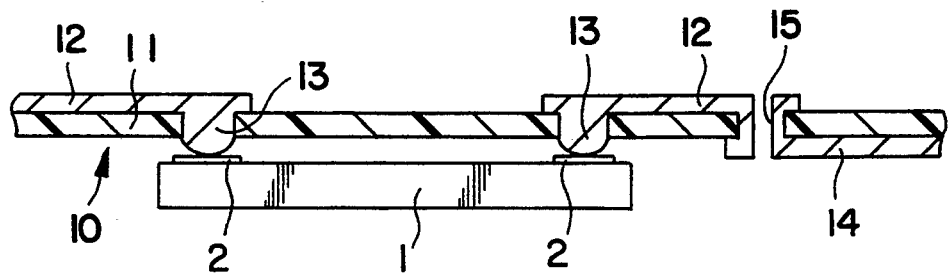
FIG. 3 is still another conceptual sectional block diagram of an IC-mounting flexible circuit board with IC pad junction protrusions disposed in such a form as to have circuit wiring patterns on both sides.

FIGS. 1-3 show conceptual sectional block diagrams of the principal parts of IC-mounting flexible circuit boards according to the present invention. As shown in FIGS. 1-3, numerals 1 and 2 denote a bare IC chip and bonding pads, respectively. The bare IC chip 1 is arranged so that it can be packaged on an IC-mounting flexible circuit board 10 via the pads 2 according to the present invention. The flexible circuit board 10 comprises a flexible insulating base 11 preferably formed with a polymer base such as a polyimide film, a desired circuit wiring pattern 12 sticking to one side of the insulating base 11, and IC pad junction protrusions 13, each of which is electrically tightly joined to the insulating base 11 at a predetermined end portion of the circuit wiring pattern 12 and passed through the insulating base 11 so as to protrude onto the bonding pad 2 of the bare IC chip 1. These IC pad junction protrusions 13 may be lined up as shown in FIG. 1 or disposed zigzag as shown in FIG. 2 in line with an arrangement of the bonding pads 2 of the bare IC chip 1; in other words, they may freely be disposed as desired. Moreover, it is also possible to construct a both-sided IC-mounting flexible circuit board 10 by adequately forming another circuit wiring pattern 14 on the side from which the IC pad junction protrusions 13 protrude and connecting the desired places of both the circuit wiring patterns 12, 14 via a connecting through-hole portion 15 in a usual manner as shown in FIG. 3.

Figure 4A:
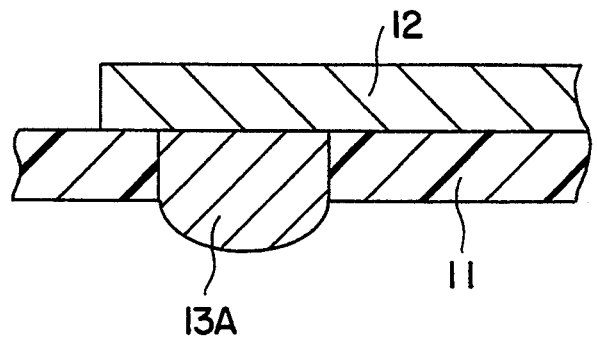
FIGS. 4(A), 4(B) and 4(C) are sectional block diagrams of the principal parts of IC pad junction protrusions according to the present invention.
Figure 4B:
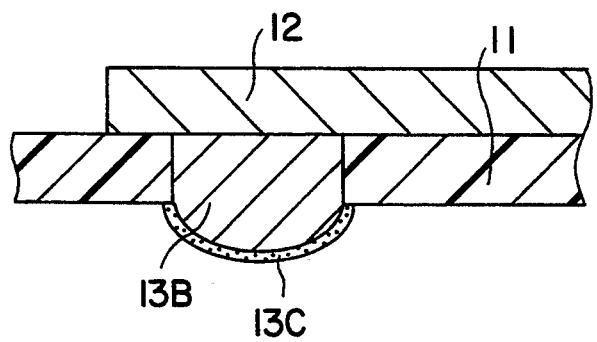
Figure 4C:
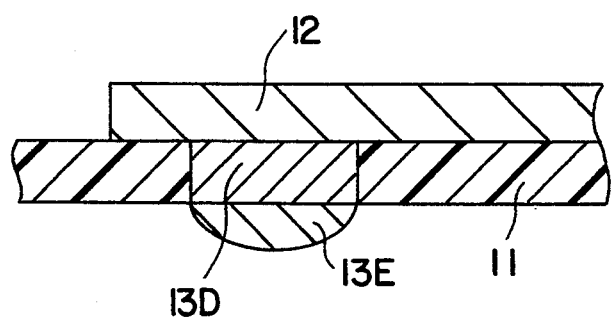

The aforementioned IC pad junction protrusions 13 may be formed in various ways as shown in FIGS. 4A-4C. More specifically, FIG. 4A refers to a construction wherein a junction protrusion 13A is wholly formed with a conductive member made of gold, tin, lead-tin alloy or the like that is readily joined to the IC pad 2; FIG. 4B to a construction wherein a junction protrusion 13B is formed with a copper plating member, whereas an adherend layer 13C formed with the conductive member made of gold, tin, lead.tin alloy or the like is deposited on the protruding outer surface thereof; and FIG. 4C to a construction wherein a conductive portion 13D passing through the insulating base 11 is first formed with the copper plated member, whereas the protruding portion is formed of a solder cream or ball capable of reflowing, or formed with a solder member 13E obtained by the adhesion of dip solder to the pertinent portion.

As shown in FIG. 4, the protruding end of such an IC pad junction protrusion is preferred to be semicircular in cross section. In order to provide a construction for securing ideal bonding properties with respect to the bare IC chip,, moreover, the omission of an adhesive layer between the insulating base 11 and the circuit wiring patterns 12, 14 is also preferred as will be described later. In any case, the IC pad junction protrusion 13 is so constructed as to be suitably supported by the flexible insulating base 11 to simply ensure a high density packaging pattern while securing not only positional accuracy but also mechanical strength.

IC-mounting flexible circuit boards of the sort described above can thus be manufactured through various techniques according to the present invention; FIGS. 5 and 6 show exemplified process flow diagrams. In the technique shown in FIG. 5, a conductive layer 12A such as copper foil is uniformly stuck onto one side of the flexible insulating base 11 made of imido polymer as what is typical of a polyimide film without using an adhesive layer therebetween to prepare a one-sided non-adhesive flexible conductive laminated board. Such a one-sided non-adhesive conductive laminated board can be constructed by forming a first conductive layer through the technique of using a casting means for casting a film member for the insulating base 11 onto the conductive layer 12A such as copper foil having a predetermined thickness, or sputtering or ion-depositing a conductive member on the insulating film base 11, and forming a thick second conductive layer by plating on the first conductive layer.

Figure 5A:
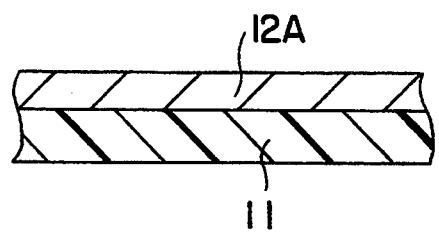
FIGS. 5(A), 5(B), 5(C) and 5(D) show a process flow diagram of an IC-mounting flexible circuit board formed using a one-sided flexible conductive laminated board according to the present invention.
Figure 5B:
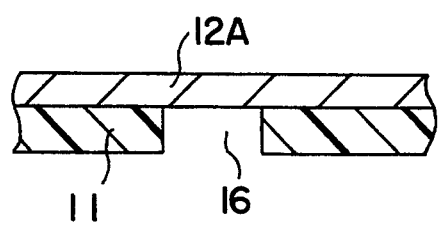
Figure 5C:
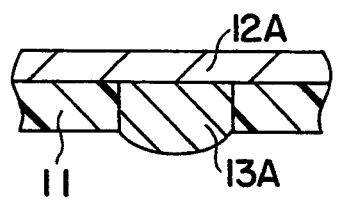
Figure 5D:
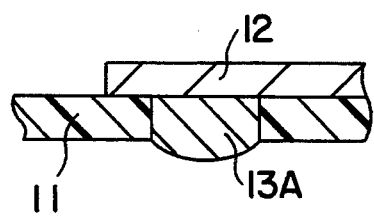

In the insulating base 11 of the one-sided non-adhesive flexible conductive laminated board, a hole 16 approximately 50 μm–100 μm across reaching the conductive layer 12A from the outside is bored, as shown in FIG. 5B, with an excimer laser means or a chemical resin etching means using a strong alkali aqueous solution, hydrazine or the like. The hole 16 thus bored in a predetermined part of the conductive layer 12A to expose the area in the insulating base 11 relative in position to a circuit wiring pattern to be formed later. The hole 16 is then filled with a conductive plating member, as a conductive member, made of gold, tin, lead-tin alloy or the like that is readily joined to the IC pad, the conductive member being provided by electroplating with or without application of a masking process to the conductive layer 12A. In this way, there is for, reed the IC pad junction protrusion 13A shown in FIG. 5B with one end tightly joined to the conductive layer 12A, the other being adequately protruding from the insulating base 11. After the step of forming the junction protrusion 13A is taken, the conductive layer 12A is patterned by normal etching in conformity with the relative position with the junction protrusion 13A with or without masking of the protrusion 13A in order to form the desired circuit wiring pattern 12 shown in FIG. 5D. The IC-mounting flexible circuit board so constructed as described above with reference to FIG. 4A can thus be produced.

Figure 6A:
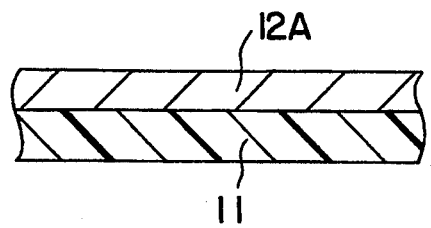
FIGS. 6(A), 6(B), 6(C), 6(D) and 6(E) show a process flow diagram of another IC-mounting flexible circuit board formed similarly according to the present invention.
Figure 6B:
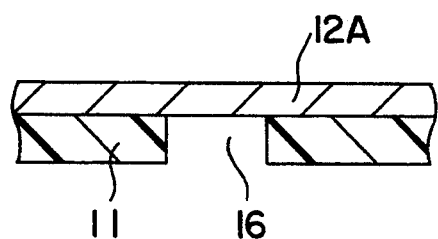
Figure 6C:
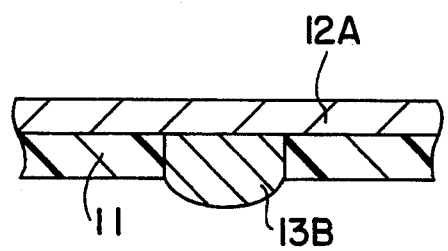
Figure 6D:
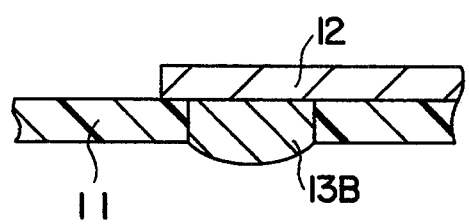
Figure 6E:
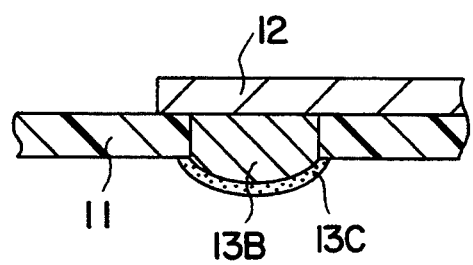

When the junction protrusion 13B is formed by filling the hole 16 with the conductive member using a copper plating means as shown in FIG. 6C in the technique stated above, the protruding outer surface of the junction protrusion 13B formed with the copper plating member as shown in FIG. 6E is plated with the conductive member made of told, tin, lead.tin alloy or the like that is readily joined to the IC pad after the patterning of circuit wiring is made likewise, so that the adherent layer 13C is formed. The construction of the IC-mounting flexible circuit board shown in FIG. 4B is thus obtained. In the technique stated above, moreover, the step of filling the hole 16 with the conductive member in FIG. 6C can be changed so that the copper plating member is applied to the hole 16 to form the conductive portion 13D. Subsequently, the solder cream or ball capable of reflowing is deposited onto the exposed surface of the conductive portion 13D or otherwise the exposed outer surface thereof is dipped into solder to obtain a IC pad junction protrusion having an additional conductive protrusion 13E that is readily joined to the IC pad.

Figure 7A:
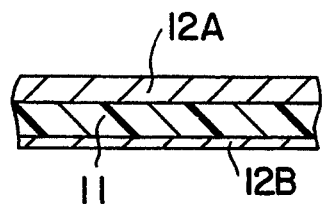
FIGS. 7(A), 7(B), 7(C), 7(D), 7(E) and 7(F) show a process flow diagram of an IC-mounting flexible circuit board formed using at both-sided flexible conductive laminated board according to the present invention.
Figure 7B:
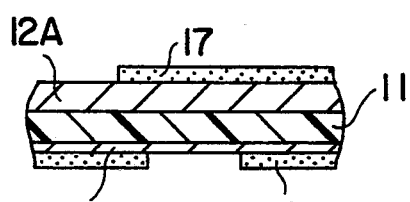

When the IC-mounting flexible circuit board is produced according to the present invention, the technique of more favorably boring a hole to be filled with the conductive member in the insulating base is suitably used in the production of the both-sided non-adhesive flexible conductive laminated board equipped with desired conductive layers on both the respective sides of the film-like insulating base made of the aforementioned imido polymer without the adhesive layer therebetween. FIG. 7 shows a process flow diagram as one of the samples of such a technique. As shown in FIG. 7A, such a both-sided non-adhesive flexible conductive laminated board having a thick conductive layer 12A approximately 35 μm thick, for instance, on one side of the insulating base 11 as described above and a thin conductive layer 12B approximately 2 μm thick on the other is prepared and a desired circuit wiring resist pattern 17 for use in forming the circuit wiring pattern is formed on the thick conductive layer 12A first, whereas a holing resist pattern 18 necessary for providing a hole in the thin conductive layer 12B is formed on the thin conductive layer 12B through exposing and developing processes using a photoresist agent simultaneously with the resist pattern 17 as shown in FIG. 7B. Although various kinds of photoresist agents may be used, one in the form of a dry photoresist film used in the embodiment shown above is preferred. If, moreover, an alkali soluble photoresist agent is used, the process of peeling off both the resist patterns 17, 18 simultaneously with the holing process can be conducted when the chemical resin etching is employed during the holing step to be taken later.

Figure 7C:
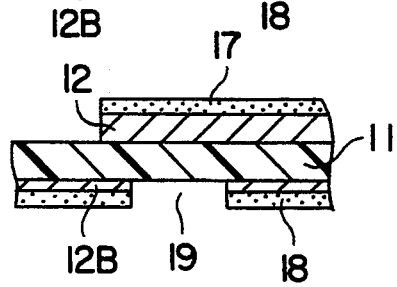
Figure 7D:
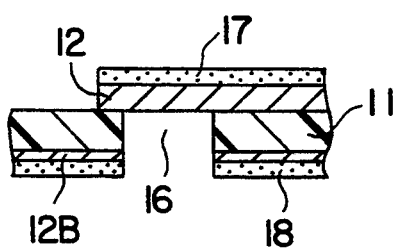
Figure 7E:
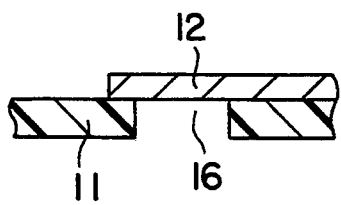
Figure 7F:
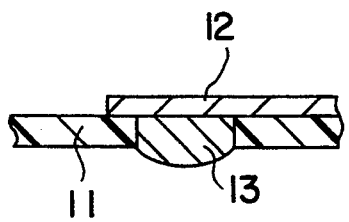
Figure 8A:
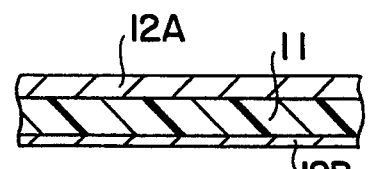
FIGS. 8(A), 8(B), 8(C), 8(D), 8(E), 8(F), 8(G) and 8(H) show a process flow diagram of another IC-mounting flexible circuit board formed simultaneously using a metal resist pattern when the formation of a circuit wiring pattern is processed according to the present invention.
Figure 8B:
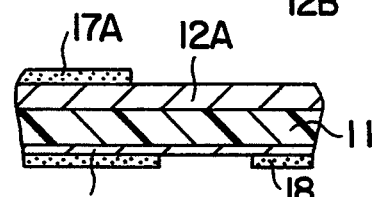
Figure 8C:
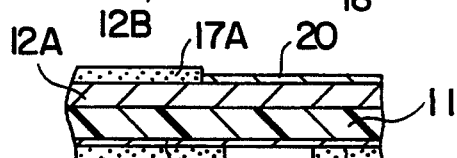
Figure 8D:
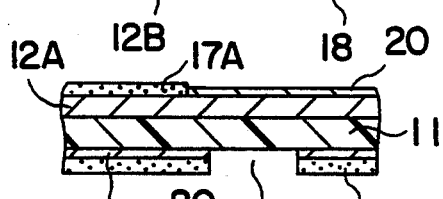
Figure 8E:
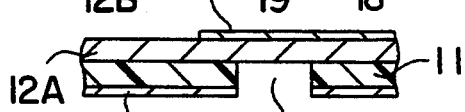
Figure 8F:
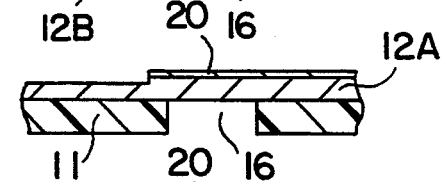
Figure 8G:
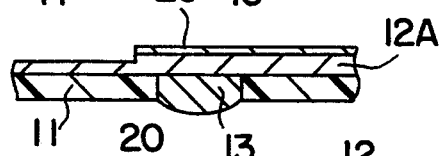
Figure 8H:
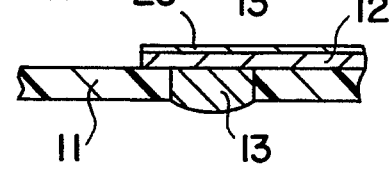
Figure 10A:
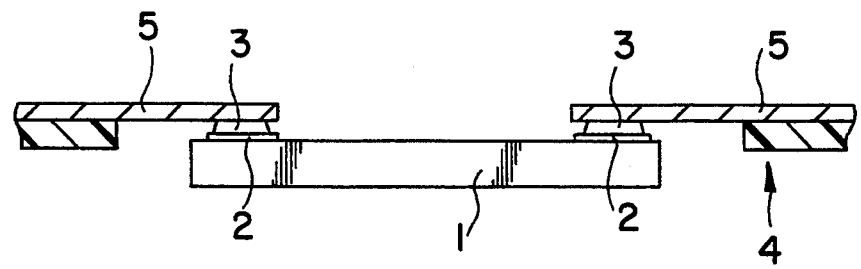
FIGS. 10(A) and 10(B) are diagrams illustrative of the technique of mounting an IC in the conventional tab method.
Figure 10B:
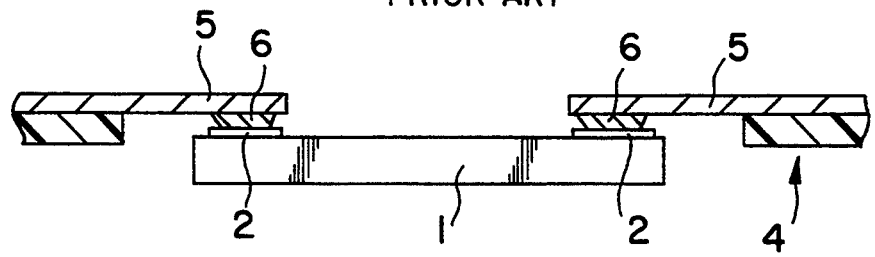
Figure 11:
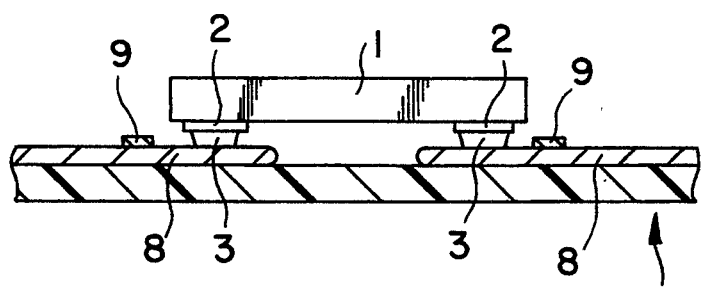
FIG. 11 is a diagram illustrative of the technique of mounting an IC in the conventional flip chip method.

As shown in FIG. 7C, the exposed portion of the thick conductive layer 12A on the side of the circuit wiring resist pattern 17 and the area of the thin conductive layer 12B exposed on the side of the holing resist pattern 18 are simultaneously removed by etching to form the circuit wiring pattern 12 on one side of the insulating base 11, whereas a hole-making conductive-layer removing portion 19 is formed on the other side thereof. At this stage, the hole 16 is formed in the insulating base 11 by letting the thin conductive layer 12B function as a masking member with the chemical resin etching means using the strong alkali aqueous solution, hydrazine or the like, or the excimer laser means. After both the resist patterns 17, 18 are removed, the whole thin conductive layer 12B is removed by etching as shown in FIG. 7E. As the final step, the circuit wiring pattern 12 thus formed is properly subjected to the masking process and the technique stipulated with reference to FIG. 4 is used to form the IC pad junction protrusion 13 by electroplating in the hole 16 as shown in FIG. 7E. The IC-mounting flexible circuit board is thus obtainable.

While the both-sided non-adhesive flexible conductive laminated board shown in FIG. 7A is used, it is also acceptable to change the processing step in such a manner as to form a desired circuit wiring pattern by forming a metal resist pattern using an etching resistant conductive member as a plating means of tin, lead, tin.-nickel alloy, gold or the like as shown in an embodiment of FIG. 8. In the case of this technique, an etching resist pattern 17A is first formed in an area other than the portion where the circuit wiring pattern is formed on the side of the thick conductive layer 12A as shown in FIG. 8B and then the holing resist pattern 18 is formed likewise by exposing and developing on the side of the thin conductive layer 12B. As shown in FIG. 8C, the holing exposure portion of the thin conductive layer 12B is then adequately subjected to the masking process and a metal resist pattern 20 as the etching resistant conductive member is formed with the electroplating means using the aforementioned tin, lead, tin.nickel alloy, gold or the like in an area corresponding to the desired circuit wiring pattern to be exposed on the thick conductive layer 12A. Thereafter, the variation of the technique described above comprises the steps of, as shown in FIGS. 8D–8H, forming hole-making conductive-layer removing portion 19 applicable to the thin conductive layer 12B, boring the hole 16 in the insulating base 11, removing the thin conductive layer 12B concurrently with the masking process applied to the side of the thick conductive layer 12A, forming the IC pad junction protrusion 13 by plating in the hole 16, and providing the circuit wiring pattern 12. In this way, it is possible, as shown in FIG. 8, to produce the IC-mounting flexible circuit board provided with the desired circuit wiring pattern 12 whose surface is covered with the metal resist pattern 20 as the etching resistant conductive member, and the IC pad junction protrusion 13 passing through the insulating base 11, electrically joined to the back end surface of the pattern 12 and protruding from the insulating base 11.

With respect to the production method of FIG. 8, it is also possible to change part of the process of FIG. 7 without providing the metal resist pattern 20 for the circuit wiring pattern 12; FIG. 9 shows a process flow diagram therefor. As in the case of the embodiment shown above, protective films 21, 22 as dry photoresist films are respectively uniformly stuck onto both sides of the both-sided non-adhesive flexible conductive laminated board. As shown in FIG. 7B, each side is exposed to light likewise to form the circuit wiring resist pattern 17 and the holing resist pattern 18 as shown in FIG. 9B, whereby with this exposure step, unexposed areas 17A, 18A are being held by the respective protective films 21, 22. Only the protective film 22 on the side of the holing resist pattern 18 is first removed to eliminate the unexposed area 18A through the developing process. As shown in FIGS. 9C–9G then, there are taken the steps of forming the conductive-layer removing portion 19 through the process of removing the holing conductive layer by etching and peeling off the holing resist pattern 18 in the same technique as described above. Subsequently, the hole 16 is bored in the insulating base 11 and the IC pad junction protrusion 13 is formed by plating. At the time these steps are completed, the protective film 21 as the masking means is removed and the desired circuit wiring pattern 12 is formed through the circuit wiring patterning process accompanied with the developing process as shown in FIGS. 9F and 9G. Finally, the junction protrusion 13 for the IC pad is formed, so that IC-mounting flexible circuit board having the same construction as what is shown in FIG. 7 becomes obtainable.

References have been made in the embodiments shown to the techniques of forming various IC pad junction protrusions in the forms described above before or after the desired circuit wiring pattern is formed using the one- or both-sided non-adhesive conductive laminated board. Instead of using such a conductive laminated board, however, there may preferably be employed, depending on the intended use, the technique of forming IC pad junction protrusions in the form described above by appropriately forming a desired circuit wiring pattern through the conductive member additive method on at least one side of a flexible insulating base offering excellent heat resistant in company with the resin etching means or the holing step through the laser holing technique applicable to the insulating base. Moreover, consideration may be taken to the step of shaping the protrusion properly while the IC pad junction protrusion is being formed or altering or adding various manufacturing processes in accordance with the form of the bare IC chip to be mounted.

Industrial Applicability

Since the IC pad junction protrusion functioning as a bump is embedded in the insulating base and supported thereby in such a state that its leading end protrudes therefrom, it is possible to form an IC pad junction protrusion offering not only excellent mechanical strength but also high positional accuracy.

A plurality of such IC pad junction protrusions may optionally be placed zigzag, for instance, to make them right fit for a high-density IC.

The provision of additional solder flow preventive dams in the conventional flip chip method can be dispensed with in the case of the IC-mounting flexible circuit board according to the present invention.

Moreover, the step of transferring bumps required in the conventional tab method is also unneeded and this contributes to cost reduction.

With the IC pad junction protrusion formed with a solder member according to the present invention, the protrusion can be formed less costly further.

As the non-adhesive flexible conductive laminated board is used, the chemical re sin etching method or excimer laser means may be employed for making it possible to form a very small hole for the formation of the IC pad junction protrusion and the IC-mounting flexible circuit board excellent in heat resistance during the application of the IC bonding process can be produced.

Even when the both-sided flexible conductive laminated board is used, the desired exposure process is applicable to both sides simultaneously, whereby the circuit wiring pattern can be aligned with the IC pad junction protrusion simply and precisely. The highly dense integration of the circuit wiring pattern and the IC pad junction protrusion can be attained as desired.

What is claimed is:

1. A process for producing an IC-mounting flexible circuit board, said process comprising the steps of:
   preparing a flexible circuit board laminate by applying conductive layers to the opposite sides of a flexible insulating base without the use of an adhesive,
   forming a desired circuit wiring pattern in a first of said conductive layers by the selective removal of the conductive material,
   removing portions of the other of said conductive layers to define hole locations, said hole locations being in registration with desired regions of said circuit wiring pattern,
   forming holes in said insulating base exposed in said hole locations,
   removing the remainder of said second conductive layer, and
   forming IC pad junction protrusions by filling the holes in said insulating base with a conductive member by plating, said IC pad junction protrusions having one end tightly joined to a desired region of said circuit wiring pattern and the other protruding from said insulating base.

2. A process for producing an IC-mounting flexible circuit board as claimed in claim 1, wherein one conductive layer is thickly formed on the formation side of said circuit wiring pattern, whereas the other conductive layer is thinly formed.

3. A process for producing an IC-mounting flexible circuit board as claimed in claim 1, wherein said IC pad junction protrusions are disposed in a zigzag pattern.

4. A process for producing an IC-mounting flexible circuit board as claimed in claim 1, wherein the step of forming said hole comprises chemical resin etching or excimer laser etching.

5. A process for producing an IC-mounting flexible circuit board, said process comprising the steps of:
    preparing a double-sided flexible circuit board laminate by applying conductive layers to the opposite sides of a flexible insulating base without the use of an adhesive,
    forming a resist pattern corresponding to a desired circuit wiring pattern on the exposed side of at least a first of said conductive layers,
    removing portions of the second of said conductive layers to define hole locations where the insulating base is exposed through said second of said conductive layers, said hole locations being in registration with different portions of said circuit wiring pattern,
    forming holes through the regions of said insulating base exposed in said hole locations,
    removing the remainder of second conductive layer,
    forming IC pad junction protrusions by filling said holes with a conductive member by plating, each of said IC pad junction protrusions having one end tightly joined to a desired region of said first conductive layer, the other end of said protrusions extending from said insulating base, and
    using said resist pattern to form a desired circuit wiring pattern.

6. A process for producing an IC-mounting flexible circuit board as claimed in claim 5, wherein said resist pattern is formed with an etching resistant conductive member.

7. A process for producing an IC-mounting flexible circuit board as claimed in claim 5, wherein said resist pattern is formed with an etching resist member.

8. A process for producing an IC-mounting flexible circuit board as claimed in claim 7, wherein said etching resist member is formed with the use of a dry photoresist film having a protective film.

9. A process for producing an IC-mounting flexible circuit board as claimed in claim 5, wherein one conductive layer is thickly formed on the formation side of said circuit wiring pattern, whereas the other conductive layer is thinly formed.

10. A process for producing an IC-mounting flexible circuit board as claimed in claim 5, wherein the step of forming said hole comprises chemical resin etching or excimer layer etching.

11. A process for producing an IC-mounting flexible circuit board as claimed in claim 5, wherein said IC pad junction protrusions are disposed in a zigzag pattern.

* * * * *

UNITED STATES PATENT AND TRADEMARK OFFICE
CERTIFICATE OF CORRECTION

PATENT NO. : 5,361,491
DATED : November 8, 1994
INVENTOR(S) : Chikafumi Oomachi and Yasuyuki Tanaka It is certified that error appears in the above-indentified patent and that said Letters Patent is hereby corrected as shown below:

Title page, item [62], after "abandoned", insert --, which was the national stage of International Application No. PCT/JP90/01413 filed Nov. 2, 1990--.

Title page, before [51] insert
  --[30] Foreign Application Priority Data
     Nov. 6, 1989 [JP] Japan ................ 1-288434--.

Column 1, line 13, "related" should read --relates--; line 14, "a to" should read --an--; line 22, "bare, i.e.," should read --i.e., bare,--.

Column 2, line 36, "at" should read --a--; line 63, "men, her" should read --member--.

Column 3, line 50, "at" should read --a--.

Column 4, line 40, "adherend" should read --adhered--; line 54, "chip,," should read --chip,--.

UNITED STATES PATENT AND TRADEMARK OFFICE
CERTIFICATE OF CORRECTION

PATENT NO. : 5,361,491
DATED : November 8, 1994
INVENTOR(S) : Chikafumi Oomachi and Yasuyuki Tanaka It is certified that error appears in the above-indentified patent and that said Letters Patent is hereby corrected as shown below:

Column 5, line 28, "for, reed" should read --formed--; line 29, "5B" should read --5C--; line 47, "told" should read --gold--; line 60, "a" should read --an--.

Column 7, line 64, "resistant" should read --resistance--.

Column 8, line 26, "re sin" should read --resin--.

Signed and Sealed this

Third Day of September, 1996

Attest:

BRUCE LEHMAN

*Attesting Officer*  Commissioner of Patents and Trademarks